United States Patent
Li et al.

(10) Patent No.: US 11,845,672 B2
(45) Date of Patent: Dec. 19, 2023

(54) ALUMINA-BASED HETEROJUNCTION MATERIAL WITH ABUNDANT OXYGEN VACANCIES AND PREPARATION METHOD THEREOF

(71) Applicant: HEBEI UNIVERSITY OF SCIENCE AND TECHNOLOGY, Shijiazhuang (CN)

(72) Inventors: Fa-tang Li, Shijiazhuang (CN); Qi Li, Shijiazhuang (CN); Shao-qiang Li, Shijiazhuang (CN); Ying Liu, Shijiazhuang (CN); Rui-hong Liu, Shijiazhuang (CN)

(73) Assignee: HEBEI UNIVERSITY OF SCIENCE AND TECHNOLOGY, Shijiazhuang (CN)

( * ) Notice: Subject to any disclaimer, the term of this patent is extended or adjusted under 35 U.S.C. 154(b) by 31 days.

(21) Appl. No.: 17/866,407

(22) Filed: Jul. 15, 2022

(65) Prior Publication Data

US 2023/0202857 A1 Jun. 29, 2023

(30) Foreign Application Priority Data

Dec. 27, 2021 (CN) .......................... 202111621214.7

(51) Int. Cl.
| | |
|---|---|
| C01F 7/308 | (2022.01) |
| C01G 29/00 | (2006.01) |
| H01L 29/24 | (2006.01) |

(52) U.S. Cl.
CPC .............. *C01F 7/308* (2013.01); *C01G 29/00* (2013.01); *H01L 29/24* (2013.01); *C01P 2006/40* (2013.01)

(58) Field of Classification Search
CPC .................................. B01J 20/08; C01G 29/00
See application file for complete search history.

(56) References Cited

FOREIGN PATENT DOCUMENTS

| CN | 106362777 A | * | 2/2017 | ............ B01J 27/125 |
| CN | 11060281 A | * | 3/2020 | .............. B01J 21/04 |

* cited by examiner

*Primary Examiner* — Khanh T Nguyen
(74) *Attorney, Agent, or Firm* — BOOTH UDALL FULLER, PLC; Rodney J. Fuller

(57) ABSTRACT

Disclosed are an alumina-based heterojunction material with abundant oxygen vacancies and a preparation method thereof. The heterojunction material is composed of alumina with abundant oxygen vacancies and bismuth-rich bismuth oxychloride. The method includes mixing aluminum nitrate nonahydrate, bismuth nitrate pentahydrate, an ammonium salt and urea, each in certain amount, under stirring to obtain a mixture B, placing the mixture B in a muffle furnace, heating the mixture B and continuing the stirring to gradually melt the mixture B to form an ionic liquid B; and subjecting the ionic liquid B to a spontaneous combustion reaction in the muffle furnace to obtain a product B, and cooling the product B to room temperature to obtain the alumina-based heterojunction material with abundant oxygen vacancies.

10 Claims, 6 Drawing Sheets

ALUMINA-BASED HETEROJUNCTION MATERIAL WITH ABUNDANT OXYGEN VACANCIES AND PREPARATION METHOD THEREOF

CROSS REFERENCE TO RELATED APPLICATION

This patent application claims the benefit and priority of Chinese Patent Application No. 202111621214.7, entitled "Alumina-based heterojunction material with abundant oxygen vacancies and preparation method thereof" filed on Dec. 27, 2021, the disclosure of which is incorporated by reference herein in its entirety as part of the present application.

TECHNICAL FIELD

The present disclosure belongs to the technical field of material synthesis and relates to an alumina-based heterojunction material with abundant oxygen vacancies and a preparation method thereof.

BACKGROUND ART

Oxidation processes induced by reactive oxygen species are widely used due to characteristics of being green, economic and sustainable. In order to obtain reactive oxygen species with high reactivity, traditional chemical, physical and biological methods have been explored; however, these methods have disadvantages of high energy consumption and low efficiency. Photocatalytic molecular oxygen activation to produce reactive oxygen species at room temperature has shown increasing potential. The carrier or exciton effect could be driven through solar energy, which breaks down the spin-forbidden reaction and produces reactive oxygen species. However, some photocatalysts have small specific surface area and poor adsorption capacity, which limit their applications in industry.

Alumina is considered as a good carrier material to enhance physical adsorption because of its large specific surface area, and widely used in the construction of heterojunction photocatalysts to increase the specific surface area and enhance the adsorption performance. In addition, bismuth-rich bismuth oxychloride has attracted extensive attention because of its excellent physical and chemical properties; however, its photocatalytic performance is limited due to poor adsorption capacity of oxygen molecule. To overcome the above defects, the construction of alumina/bismuth-rich bismuth oxychloride heterojunction photocatalytic material is an effective method which could not only enhance the adsorption capacity of oxygen molecule, but also improve the separation efficiency of carrier, making it possible to significantly improve photocatalytic performance. However, sole physical adsorption in alumina is not enough to meet the needs of industrial production, which could be effectively improved by constructing oxygen vacancies. A positive center of the oxygen vacancy could effectively capture electrons and thus reduce the recombination of photogenerated electrons and holes. Moreover, a large number of localized electrons around oxygen vacancy could be conducive to chemical adsorption of oxygen molecules and reactants. Therefore, introducing oxygen vacancies into alumina can make it have dual functions of physical and chemical adsorption of molecular oxygen. This would be more conducive to the industrial applications of alumina materials and alumina-based heterojunction photocatalytic materials.

However, it is difficult to introduce oxygen vacancies into alumina due to the weak reducibility of Al ions. It has been reported that oxygen vacancies are introduced by CO reduction treatment (Xie et al. *J. Catal.* 397 (2021) 172-182) or using electron beam evaporation and annealing process (Zhu et al. *ACS Appl. Mater. Interfaces* 13 (2021) 35795-35803). Therefore, it is difficult to quickly prepare alumina materials with a large number of oxygen vacancies using the existing methods.

SUMMARY

An object of the present disclosure is to provide an alumina-based heterojunction material with abundant oxygen vacancies and a preparation method thereof. The alumina-based heterojunction material with abundant oxygen vacancies has dual advantages of oxygen vacancy and heterojunction, which overcome problems of poor adsorption and photocatalytic performances of traditional materials. An ionic liquid spontaneous combustion method used herein is simple, fast and low-cost, which overcomes problems of complex operation and high energy consumption of traditional methods.

Another object of the present disclosure is to provide a simple method for preparing an alumina with unsaturated coordination and abundant oxygen vacancies.

In order to achieve the above objects, the present disclosure provides the following technical solutions.

Provided is an alumina-based heterojunction material with abundant oxygen vacancies, which is composed of $Al_2O_3$ with abundant oxygen vacancies and bismuth-rich bismuth oxychloride $Bi_{12}O_{17}Cl_2$.

In some embodiments, the method for preparing the alumina with abundant oxygen vacancies comprises steps of
firstly mixing aluminum nitrate nonahydrate, an ammonium salt, and urea in a molar ratio of 1:(0.5-3.0):(0.5-2.0) under stirring to obtain a mixture A, placing the mixture A in a muffle furnace, and heating the mixture A at a temperature of 200-600° C. to gradually melt the mixture A to form an ionic liquid A; and
maintaining the temperature, subjecting the ionic liquid A to a spontaneous combustion reaction in the muffle furnace to obtain a product A, and cooling the product A to room temperature to obtain the $Al_2O_3$ with abundant oxygen vacancies.

In some embodiments, the mixture A is heated at a temperature of 500° C.

In some embodiments, the ammonium salt includes at least one ammonium halides selected from the group consisting of dimethylammonium chloride, trimethylammonium chloride, tetramethylammonium chloride, diethylammonium chloride, 2-bromoethylamine hydrobromate, tetrabutyl ammonium bromide, and tetraethylammonium iodide.

In some embodiments, the molar ratio of aluminum nitrate nonahydrate, the ammonium salt and urea is in a range of 1:(0.5-1.5):(0.5-1.0).

In some embodiments, the molar ratio of aluminum nitrate nonahydrate, the ammonium salt and urea is 1:1.5:0.5.

Provided is a method for preparing an alumina-based heterojunction material with abundant oxygen vacancies, comprising the following steps:
a) mixing bismuth nitrate pentahydrate, aluminum nitrate nonahydrate, an ammonium salt, and urea under stirring in a molar ratio of 12:(1-4):2:(2-12) to obtain a mixture B, placing the mixture B in a muffle furnace, and heating the mixture B at a temperature of 200-500° C. to gradually melt to the mixture B to form an ionic liquid B, and continuing the stirring to be uniform; and b) maintaining the temperature, subjecting the ionic liquid B to a spontaneous combustion reaction in the muffle furnace to obtain a product B, and cooling the product B to room temperature to obtain the alumina-based heterojunction material with abundant oxygen vacancies.

In some embodiments, the molar ratio of bismuth nitrate pentahydrate, aluminum nitrate nonahydrate, the ammonium salt, and urea is in a range of 12:(1.5-3):2:(4-8).

In some embodiments, the mixture B is heated at a temperature of 300-450° C., preferably 350-400° C.

Compared with the prior art, the technical solutions according to the present disclosure have the following outstanding effects:

(1) The alumina-based $Al_2O_3/Bi_{12}O_{17}C_{12}$ heterojunction material with abundant oxygen vacancies provided by the present disclosure has significantly increased specific surface area and greatly improved ability of adsorbing oxygen, thus overcomes the problems of poor adsorption and photocatalytic performance of traditional materials and provides a reference for the construction of heterogeneous photocatalysts.

(2) The method according to the present disclosure is suitable for industrialized production because of simple equipment and preparation method, low-cost as well as high yield.

(3) In the present disclosure, alumina with unsaturated coordination is prepared in situ using ionic liquid spontaneous combustion method. Aluminum nitrate nonahydrate is used as an anion donor and ammonium salt acts as a cation donor, which could form an ionic liquid at a certain temperature. A reducing atmosphere could be constructed by changing the ratio of fuel, resulting in the escape of lattice oxygen, the change in the coordination number of Al and O ions, and the generation of oxygen vacancies.

(4) In the present disclosure, an alumina material with abundant oxygen vacancies is prepared, enabling that the physical and chemical adsorption capacities of oxygen are improved. Specifically, the large specific surface area enhances the physical adsorption of molecular oxygen and the abundant localized electrons around the oxygen vacancies enhance the chemical adsorption capacity of material.

(5) The alumina-based heterojunction material with abundant oxygen vacancies and the alumina with abundant oxygen vacancies according to the present disclosure are widely used. The alumina-based heterojunction material with abundant oxygen vacancies has excellent photocatalytic performance and could be used in the fields such as pollutant degradation, $CO_2$ reduction, and hydrogen production. Alumina with unsaturated coordination and abundant oxygen vacancies could be used as a support for industrial production and also be used to rivet metal atoms.

The products according to the present disclosure have broad application prospects as a photocatalyst.

DETAILED DESCRIPTION OF THE EMBODIMENTS

The present disclosure is further described in detail below with reference to the drawings and specific examples. As used herein, the phrase "muffle furnace" means a furnace where materials are heated to produce changes in physiological properties.

Example 1

$Al_2O_3$ with unsaturated coordination and abundant oxygen vacancies was prepared as follows:

(1) Aluminum nitrate nonahydrate, diethylammonium chloride, and urea were mixed under stirring in a molar ratio of 1:0.5:2, obtaining a mixture A. The mixture A was then placed in a muffle furnace and heated to 200° C. In the muffle furnace, the mixture A was gradually melted to form an ionic liquid A.

(2) The above temperature was maintained in the muffle furnace, and the ionic liquid A was subjected to a spontaneous combustion reaction, obtaining a product A. The product A was cooled to room temperature, obtaining a pure $Al_2O_3$ with unsaturated coordination and abundant oxygen vacancies.

The obtained product was characterized by XRD, UV-Vis DRS, EPR, $^{27}Al$ NMR and $N_2$ adsorption and desorption tests. The results are shown in FIG. 1, FIG. 2, FIG. 3, FIG. 4 and FIG. 5 respectively.

Figure 1:
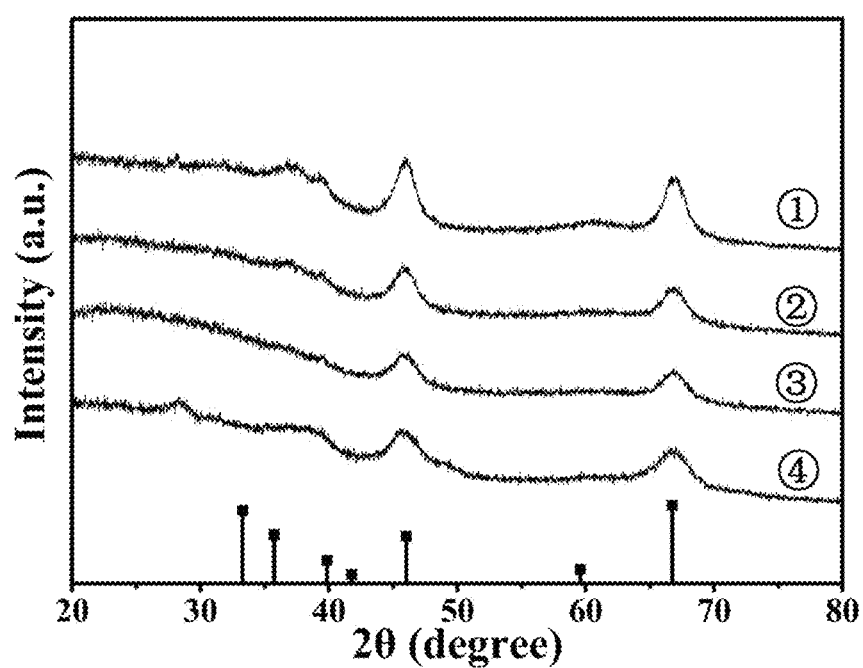
FIG. 1 shows X-ray diffraction (XRD) patterns of the defective alumina prepared in Examples 1-4.

The XRD patterns are shown in FIG. 1, which have scanning angle (2θ) as abscissa, and diffraction peak intensity as ordinate. From the XRD pattern ① in FIG. 1, it can be seen that the product has a pure $Al_2O_3$ phase.

Figure 2:
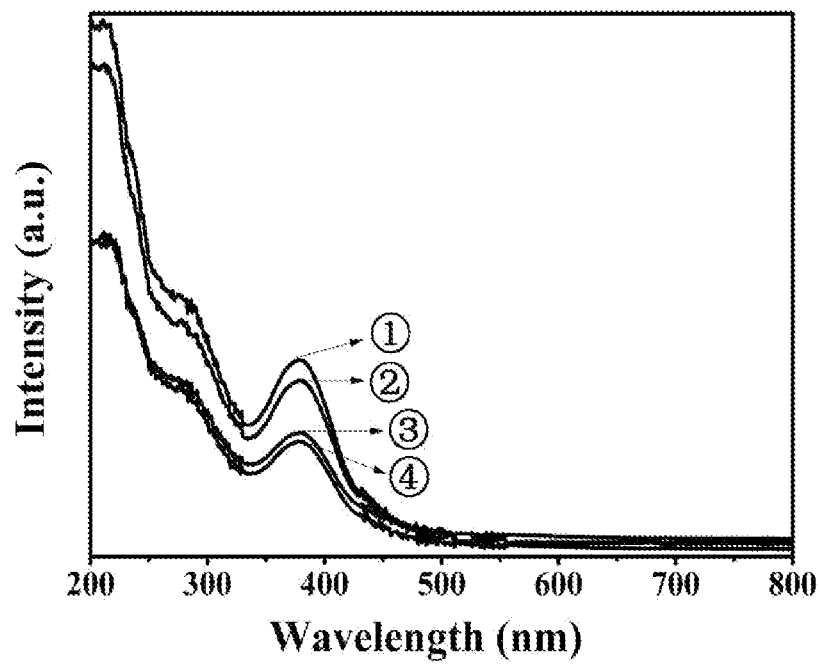
FIG. 2 shows ultraviolet-visible diffuse reflection spectroscopy (UV-Vis DRS) spectra of the defective alumina prepared in Examples 1-4.

The UV-Vis DRS spectra are shown in FIG. 2, which have wavelength as abscissa and intensity as ordinate. According to curve CD in FIG. 2, a band gap is calculated as about 4.927 eV according to a formula $\alpha(h\nu)=a(h\nu-E_g)^2$. Due to the wide band gap, the prepared $Al_2O_3$ material could not be excited by light, which makes it possible to act as an insulator for adsorbing oxygen and storing electrons.

Figure 3:
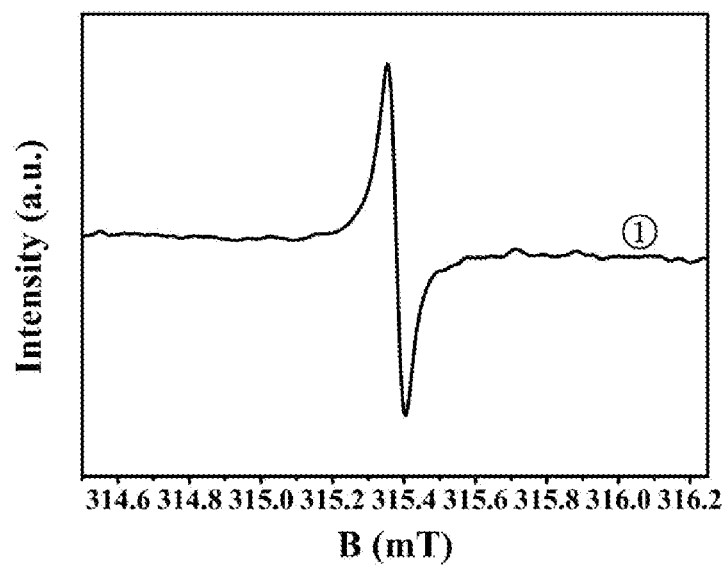
FIG. 3 shows an electron paramagnetic resonance (EPR) spectrum of the defective alumina prepared in Example 1.

The EPR spectrum is shown in FIG. 3, which has magnetic field intensity (B) as abscissa and signal intensity as ordinate. It can be seen from the curve CD in FIG. 3 that there is an obvious signal peak at g=2.000, which corresponds to the characteristic signal of oxygen vacancy, indicating the existence of oxygen vacancies in the prepared $Al_2O_3$ material.

Figure 4:
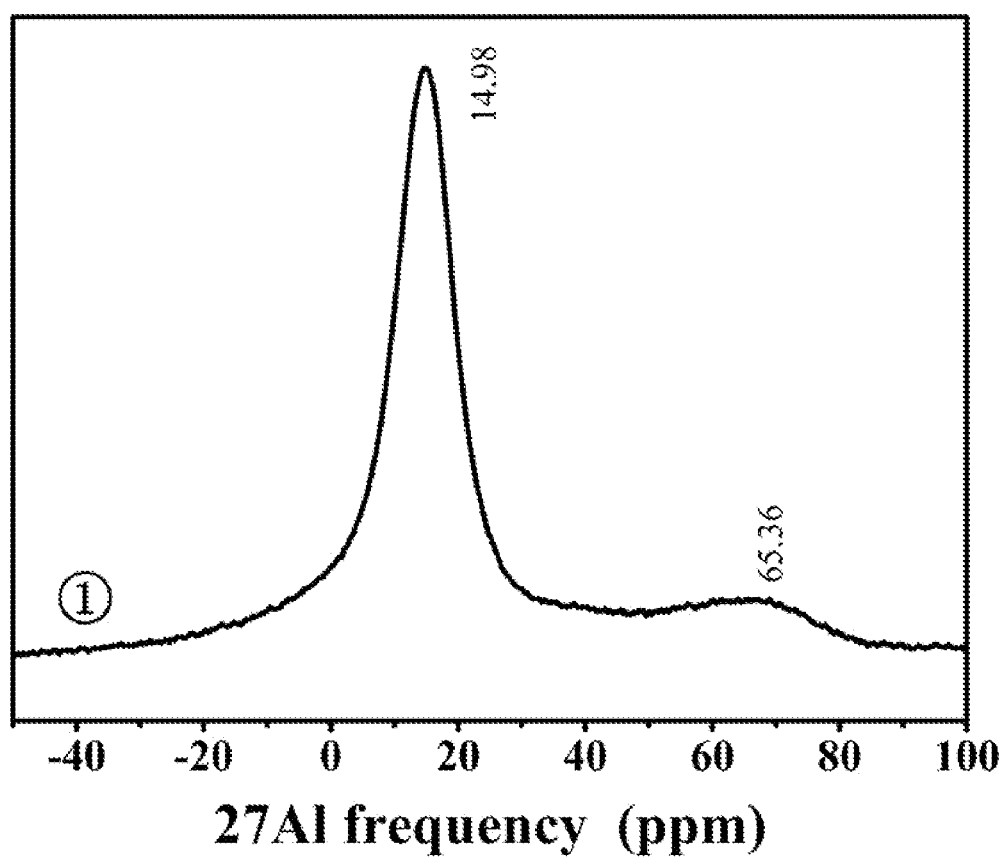
FIG. 4 shows a $^{27}Al$ nuclear magnetic resonance ($^{27}Al$ NMR) spectrum of the defective alumina prepared in Example 1.

The $^{27}Al$ NMR spectrum is shown in FIG. 4, which has chemical shift (ppm) as abscissa and absorption peak intensity as ordinate. It can be seen from the curve ① in FIG. 4 that there are four-coordinated alumina (14.98 ppm) and six-coordinated alumina (65.36 ppm).

Figure 5:
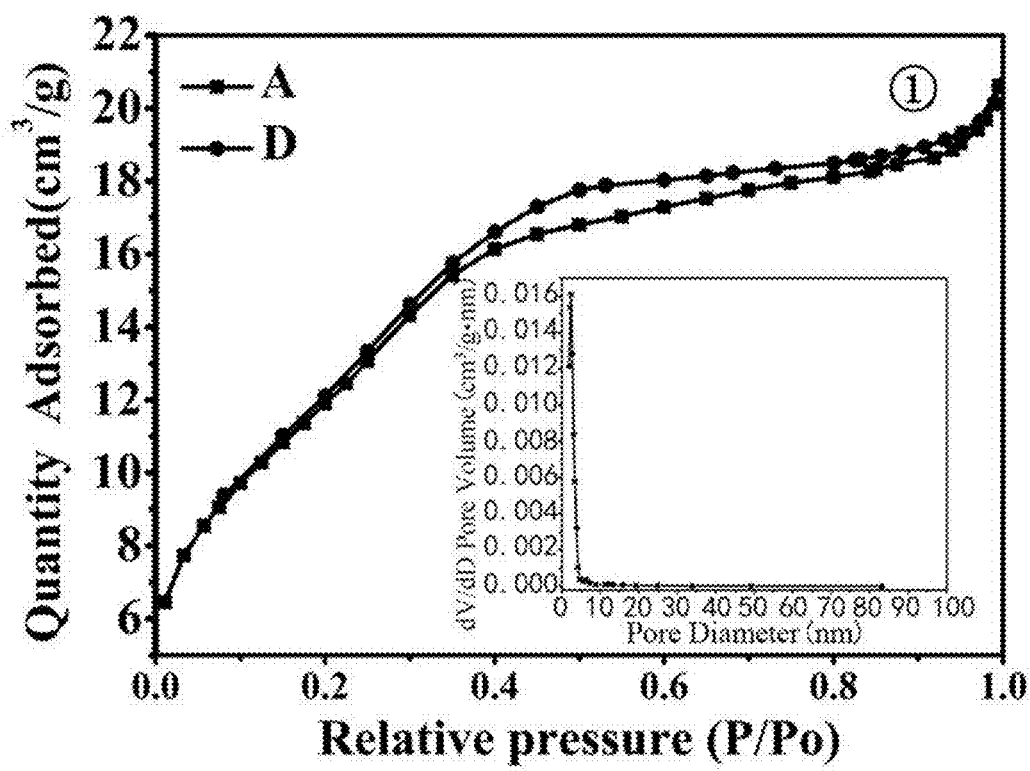
FIG. 5 shows a $N_2$ adsorption-desorption curve of the defective alumina prepared in Example 1.

The curve of $N_2$ absorption and desorption is shown in FIG. 5, which has relative pressure as abscissa and quantity adsorbed as ordinate. In FIG. 5, "A" represents adsorption and "D" represents desorption. The curve in the inset of FIG. 5 has average pore diameter as abscissa, and dV/dD pore volume as ordinate. According to the curve ①, i.e. $N_2$ adsorption-desorption curve in FIG. 5, the prepared $Al_2O_3$ material has a specific surface area of 45.2467 $m^2/g$ and an average pore diameter of 3.0120 nm. The obtained defective $Al_2O_3$ has large specific surface area.

Example 2

$Al_2O_3$ with unsaturated coordination and abundant oxygen vacancies was prepared as follows:
(1) Aluminum nitrate nonahydrate, diethylammonium chloride, trimethylammonium chloride, and urea were mixed under stirring in a molar ratio of 1:0.5:2.5:0.5, obtaining a mixture A. The mixture A was then placed in a muffle furnace and heated to 400° C. In the muffle furnace, the mixture A was gradually melted to form an ionic liquid A.
(2) The above temperature was maintained in the muffle furnace, and the ionic liquid A was subjected to a spontaneous combustion reaction, obtaining a product A. The product A was cooled to room temperature, obtaining the final product.

The obtained final product was characterized by XRD, and UV-Vis DRS. The results are shown in FIG. 1 (curve ②) and FIG. 2 (②) respectively. The curve ② of the XRD patterns in FIG. 1 shows that the product has an $Al_2O_3$ crystalline phase. The curve ② of the UV-Vis DRS spectra in FIG. 2 shows that the alumina prepared in this example has the same light absorption characteristics as the alumina prepared with different raw material ratios in other examples.

Example 3

$Al_2O_3$ with unsaturated coordination and abundant oxygen vacancies was prepared as follows:
(1) Aluminum nitrate nonahydrate, tetrabutylammonium bromide, and urea were mixed under stirring in a molar ratio of 1:1:0.5, obtaining a mixture A. The mixture A was then placed in a muffle furnace and heated to 600° C. In the muffle furnace, the mixture A was gradually melted to form an ionic liquid A.
(2) The above temperature was maintained in the muffle furnace, and the ionic liquid A was subjected to a spontaneous combustion reaction, obtaining a product A. The product A was cooled to room temperature, obtaining a pure $Al_2O_3$ with unsaturated coordination and abundant oxygen vacancies.

The obtained product was characterized by XRD, and UV-Vis DRS. The results are shown in FIG. 1 (curve ③) and FIG. 2 (curve ③) respectively. The curve ③ of the XRD patterns in FIG. 1 shows that the product has an $Al_2O_3$ crystalline phase. The curve ③ of the UV-Vis DRS spectra in FIG. 2 shows that the alumina prepared in this example has the same light absorption characteristics as the alumina prepared with different raw material ratios in other examples.

Example 4

$Al_2O_3$ with unsaturated coordination and abundant oxygen vacancies was prepared as follows:
(1) Aluminum nitrate nonahydrate, tetrabutylammonium bromide, and urea were mixed under stirring in a molar ratio of 1:1.5:2, obtaining a mixture A. The mixture A was then placed in a muffle furnace and heated to 500° C. In the muffle furnace, the mixture A was gradually melted to form an ionic liquid A.
(2) The above temperature was maintained in the muffle furnace, and the ionic liquid A was subjected to a spontaneous combustion reaction, obtaining a product A. The product A was cooled to room temperature, obtaining a pure $Al_2O_3$ material with unsaturated coordination and abundant oxygen vacancies.

The obtained product was characterized by XRD, and UV-Vis DRS. The results are shown in FIG. 1 (curve ④) and FIG. 2 (curve ④) respectively. The curve ④ of the XRD patterns in FIG. 1 indicates that the product is composed of $Al_2O_3$. The curve ④ of the UV-Vis DRS spectra in FIG. 2 shows that the alumina prepared in this example has the same light absorption characteristics as the alumina prepared with different raw material ratios in other examples.

Example 5

A alumina-based heterojunction material with abundant oxygen vacancies was prepared by compounding $Al_2O_3$ with unsaturated coordination and abundant oxygen vacancies with $Bi_{12}O_{17}Cl_2$ as follows:
(1) Bismuth nitrate pentahydrate, aluminum nitrate nonahydrate, diethylammonium chloride, and urea were mixed under stirring in a molar ratio of 12:2:2:6, obtaining a mixture B. The mixture B was then placed in a muffle furnace and heated to 500° C. In the muffle furnace, the mixture B was gradually melted to form an ionic liquid B.
(2) The above temperature was maintained in the muffle furnace, and the ionic liquid B was subjected to a spontaneous combustion reaction, obtaining a product B. The product B was then cooled to room temperature, obtaining a composite of $Al_2O_3$ and $Bi_{12}O_{17}Cl_2$.

The obtained product sample was characterized by high resolution transmission electron microscope (HRTEM), $O_2$-TPD, EPR-$.O_2^-$ and EPR-$.OH$. The results are shown in FIG. 6, FIG. 7, FIG. 8 and FIG. 9 respectively.

Figure 6:
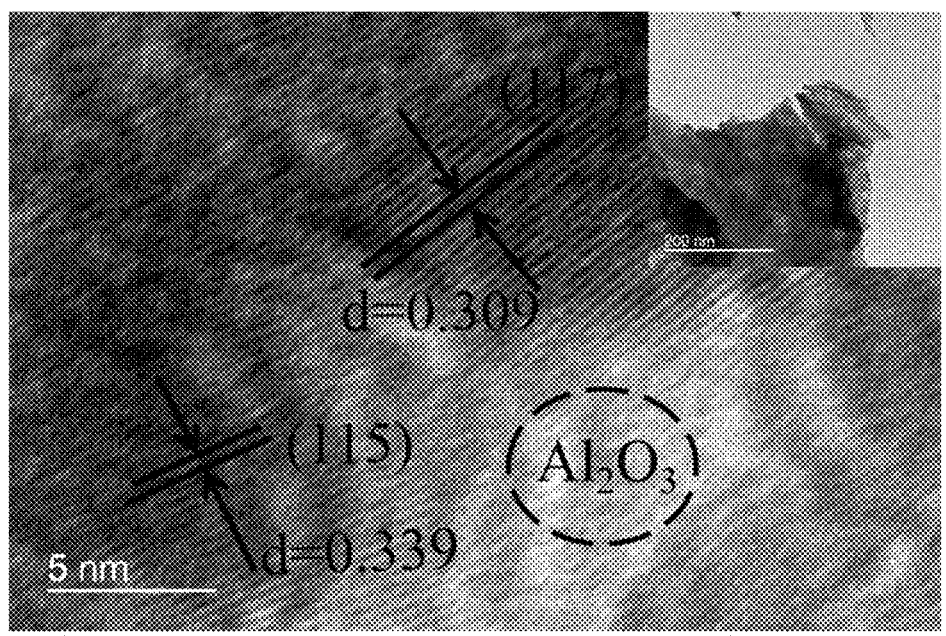
FIG. 6 is a transmission electron microscope (TEM) image of the $Al_2O_3/Bi_{12}O_{17}Cl_2$ composite prepared in Example 5.

In FIG. 6, lattice fringes of $Bi_{12}O_{17}Cl_2$ can be observed, indicating the existence of $Bi_{12}O_{17}Cl_2$, while the vague part is attributed to $Al_2O_3$, indicating that $Al_2O_3$ is closely combined with $Bi_{12}O_{17}Cl_2$.

Figure 7:
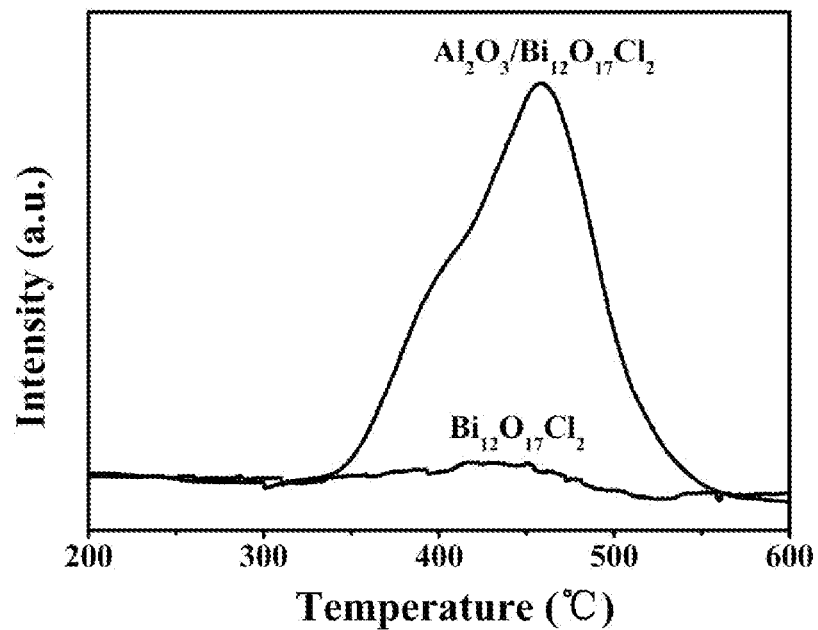
FIG. 7 shows an oxygen temperature-programmed desorption ($O_2$-TPD) curve of $Al_2O_3/Bi_{12}O_{17}Cl_2$ composite prepared in Example 5.

The $O_2$-TPD spectrum is shown in FIG. 7, which has temperature as abscissa, and adsorption intensity as ordinate. It can be seen from FIG. 7 that the oxygen-adsorption ability is greatly improved after $Bi_{12}O_{17}Cl_2$ is introduced into the alumina with oxygen vacancies, which is attributed to the dual functions of physical and chemical adsorption of molecular oxygen on alumina with oxygen vacancies.

Figure 8:
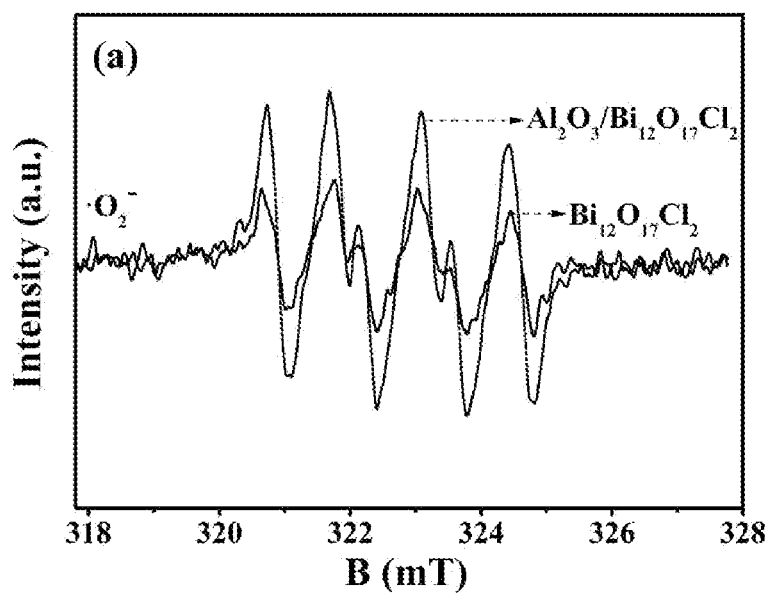
FIG. 8 shows an electron paramagnetic resonance (EPR) spectrum of ●$O_2^-$ (EPR-●OH) in $Al_2O_3/Bi_{12}O_{17}Cl_2$ composite prepared in Example 5.

FIG. 8 shows the EPR spectrum of $.O_2^-$, which is used to detect the amount of oxygen molecules activation product $.O_2^-$ in the product sample and has magnetic field intensity (B) as abscissa, and signal intensity as ordinate. It can be seen from this figure that the amount of .$O_2^-$ is higher than that of $Bi_{12}O_{17}Cl_2$ in the $Al_2O_3/Bi_{12}O_{17}Cl_2$ heterojunction photocatalyst, indicating that the introduction of alumina with abundant oxygen vacancies significantly improves the adsorption and activation of oxygen molecules and promotes the formation of reactive oxygen species .$O_2^-$.

Figure 9:
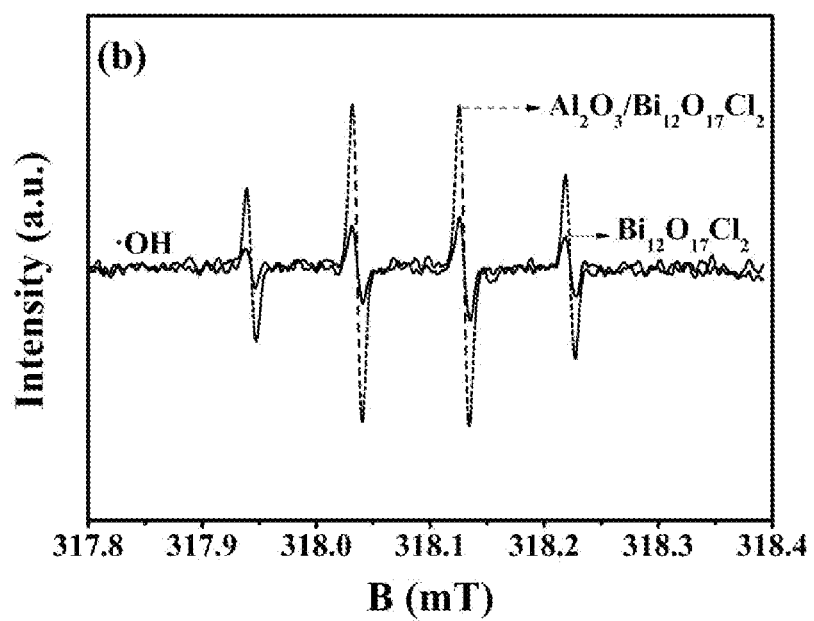
FIG. 9 shows an electron paramagnetic resonance spectrum of ●OH (EPR-●OH) in $Al_2O_3/Bi_{12}O_{17}Cl_2$ composite prepared in Example 5.

FIG. 9 shows the EPR spectrum of .OH, which is used to detect the amount of activation product .OH of oxygen molecules in the product sample and has magnetic field intensity (B) as abscissa, and signal intensity as ordinate. It can be seen from this figure that the amount of .OH is higher than that of $Bi_{12}O_{17}Cl_2$ in the $Al_2O_3/Bi_{12}O_{17}Cl_2$ heterojunction photocatalyst, indicating that the introduction of alumina with abundant oxygen vacancies significantly improves the adsorption and activation of oxygen molecules and promotes the formation of reactive oxygen species .OH.

Example 6

An alumina-based heterojunction material with abundant oxygen vacancies was prepared by compounding $Al_2O_3$ with unsaturated coordination and abundant oxygen vacancies with $Bi_{12}O_{17}Cl_2$ as follows:
(1) Bismuth nitrate pentahydrate, aluminum nitrate nonahydrate, diethylammonium chloride, and urea were mixed under stirring in a molar ratio of 12:1:2:3, obtaining a mixture B. The mixture B was then placed in a muffle furnace and heated to 500° C. In the muffle furnace, the mixture B was gradually melted to form an ionic liquid B.
(2) The above temperature was maintained in the muffle furnace, and the ionic liquid B was subjected to a spontaneous combustion reaction, obtaining a product B. The product B was then cooled to room temperature, obtaining a composite of $Al_2O_3$ and $Bi_{12}O_{17}Cl_2$.

Example 7

An alumina-based heterojunction material with abundant oxygen vacancies was prepared by compounding $Al_2O_3$ with unsaturated coordination and abundant oxygen vacancies with $Bi_{12}O_{17}Cl_2$ as follows:
(1) Bismuth nitrate pentahydrate, aluminum nitrate nonahydrate, trimethylammonium chloride, and urea were mixed under stirring in a molar ratio of 12:4:2:12, obtaining a mixture B. The mixture B was then placed in a muffle furnace and heated to 500° C. In the muffle furnace, the mixture B was gradually melted to form an ionic liquid B.
(2) The above temperature was maintained in the muffle furnace, and the ionic liquid B was subjected to a spontaneous combustion reaction, obtaining a product B. The product B was then cooled to room temperature, obtaining a composite of $Al_2O_3$ and $Bi_{12}O_{17}Cl_2$.

Example 8

An alumina-based heterojunction material with abundant oxygen vacancies was prepared by compounding $Al_2O_3$ with unsaturated coordination and abundant oxygen vacancies with $Bi_{12}O_{17}Cl_2$ as follows:
(1) Bismuth nitrate pentahydrate, aluminum nitrate nonahydrate, tetramethylammonium chloride, and urea were mixed under stirring in a molar ratio of 12:3:2:9, obtaining a mixture B. The mixture B was then placed in a muffle furnace and heated to 500° C. In the muffle furnace, the mixture B was gradually melted to form an ionic liquid B.
(2) The above temperature was maintained in the muffle furnace, and the ionic liquid B was subjected to a spontaneous combustion reaction, obtaining a product B. The product B was then cooled to room temperature, obtaining a composite of $Al_2O_3$ and $Bi_{12}O_{17}Cl_2$, i.e., the alumina-based heterojunction material with abundant oxygen vacancies.

What is claimed is:

1. An alumina-based heterojunction material with abundant oxygen vacancies, which is composed of $Al_2O_3$ with abundant oxygen vacancies and bismuth-rich bismuth oxychloride $Bi_{12}O_{17}Cl_2$.

2. A method for preparing the $Al_2O_3$ with abundant oxygen vacancies as defined in claim 1, comprising
mixing aluminum nitrate nonahydrate, an ammonium salt, and urea in a molar ratio of 1:(0.5-3.0):(0.5-2.0) under stirring to obtain a mixture A, placing the mixture A in a muffle furnace, and heating the mixture A at a temperature of 200-600° C. to gradually melt the mixture A to form an ionic liquid A; and
maintaining the temperature, subjecting the ionic liquid A to a spontaneous combustion reaction in the muffle furnace to obtain a product A, and cooling the product A to room temperature to obtain the $Al_2O_3$ with abundant oxygen vacancies.

3. The method of claim 2, wherein the mixture A is heated at a temperature of 500° C.

4. The method of claim 2, wherein the ammonium salt comprises at least one ammonium halide selected from the group consisting of dimethylammonium chloride, trimethylammonium chloride, tetramethylammonium chloride, diethylammonium chloride, 2-bromoethylamine hydrobromate, tetrabutyl ammonium bromide, and tetraethylammonium iodide.

5. The method of claim 2, wherein the molar ratio of aluminum nitrate nonahydrate, the ammonium salt, and urea is in a range of 1:(0.5-1.5):(0.5-1.0).

6. The method of claim 2, wherein the molar ratio of aluminum nitrate nonahydrate, the ammonium salt, and urea is 1:1.5:0.5.

7. A method for preparing an alumina-based heterojunction material with abundant oxygen vacancies, comprising steps of
a) mixing bismuth nitrate pentahydrate, aluminum nitrate nonahydrate, an ammonium salt, and urea under stirring in a molar ratio of 12:(1-4):2:(2-12) to obtain a mixture B, placing the mixture B in a muffle furnace, heating the mixture B at a temperature of 200-500° C. to gradually melt the mixture B to form an ionic liquid B, and continuing the stirring to be uniform; and
b) maintaining the temperature, subjecting the ionic liquid B to a spontaneous combustion reaction in the muffle furnace to obtain a product B, and cooling the product B to room temperature to obtain the alumina-based heterojunction material with abundant oxygen vacancies.

8. The method of claim 7, wherein the molar ratio of bismuth nitrate pentahydrate, aluminum nitrate nonahydrate, the ammonium salt, and urea is in a range of 12:(1.5-3):2:(4-8).

9. The method of claim 7, wherein the mixture B is heated at a temperature of 300-450° C.

10. The method of claim 7, wherein the mixture B is heated at a temperature of 350-400° C.

\* \* \* \* \*